(12) United States Patent
Sato

(10) Patent No.: US 10,396,071 B2
(45) Date of Patent: Aug. 27, 2019

(54) SEMICONDUCTOR DEVICE HAVING A SENSE DIODE PORTION

(71) Applicant: FUJI ELECTRIC CO., LTD., Kanagawa (JP)

(72) Inventor: Shigeki Sato, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/901,911

(22) Filed: Feb. 22, 2018

(65) Prior Publication Data

US 2018/0294259 A1 Oct. 11, 2018

(30) Foreign Application Priority Data

Apr. 6, 2017 (JP) ................... 2017-075942

(51) Int. Cl.
*H01L 27/06* (2006.01)
*H01L 29/739* (2006.01)
(Continued)

(52) U.S. Cl.
CPC ...... *H01L 27/0664* (2013.01); *H01L 27/0727* (2013.01); *H01L 29/0615* (2013.01);
(Continued)

(58) Field of Classification Search
CPC ............ H01L 27/0664; H01L 29/8611; H01L 29/872; H01L 29/8613; H01L 29/0646; H01L 29/861; H01L 29/0615; H01L 29/7397; H01L 29/0649; H01L 29/0619; H01L 27/0629; H01L 27/0635;
(Continued)

(56) References Cited

U.S. PATENT DOCUMENTS 5,687,049 A 11/1997 Mangtani
2009/0114947 A1* 5/2009 Fukuda ............... H01L 27/0664
257/140
(Continued)

FOREIGN PATENT DOCUMENTS

JP H09-233838 A 9/1997
JP 2002-110986 A 4/2002
(Continued)

*Primary Examiner* — Jarrett J Stark

(57) ABSTRACT

A semiconductor device is provided, in which a loss of a sensing element is small. A semiconductor device including a semiconductor substrate is provided, the semiconductor device including: an upper-surface electrode that is provided on an upper surface of the semiconductor substrate; a sensing electrode that is provided on the upper surface of the semiconductor substrate and is separated from the upper-surface electrode; a lower-surface electrode that is provided on a lower surface of the semiconductor substrate; a main transistor portion that is provided on the semiconductor substrate and is connected to the upper-surface electrode and the lower-surface electrode; a main diode portion that is provided on the semiconductor substrate and is connected to the upper-surface electrode and the lower-surface electrode; and a sense diode portion that is provided to the semiconductor substrate and is connected to the sensing electrode and the lower-surface electrode.

11 Claims, 13 Drawing Sheets

(51) Int. Cl.
*H01L 29/861* (2006.01)
*H01L 29/06* (2006.01)
*H01L 29/872* (2006.01)
*H01L 27/07* (2006.01)

(52) U.S. Cl.
CPC ...... *H01L 29/0646* (2013.01); *H01L 29/7397* (2013.01); *H01L 29/861* (2013.01); *H01L 29/8611* (2013.01); *H01L 29/8613* (2013.01); *H01L 29/872* (2013.01); *H01L 27/067* (2013.01); *H01L 27/0611* (2013.01); *H01L 27/075* (2013.01); *H01L 27/0711* (2013.01); *H01L 27/0716* (2013.01); *H01L 27/0755* (2013.01); *H01L 29/0619* (2013.01); *H01L 29/0649* (2013.01)

(58) Field of Classification Search
CPC ............. H01L 27/2454; H01L 29/7827; H01L 21/823487; H01L 21/823885; H01L 27/07–0716; H01L 27/0727; H01L 27/075–0761
See application file for complete search history.

(56) References Cited

U.S. PATENT DOCUMENTS

| | | | |
|---|---|---|---|
| 2013/0242438 A1 | 9/2013 | Fukuta et al. | |
| 2015/0311285 A1* | 10/2015 | Momota | H01L 29/0696 257/139 |
| 2016/0126156 A1* | 5/2016 | Osaga | H01L 29/861 257/140 |
| 2016/0211361 A1* | 7/2016 | Nishimura | H01L 29/7805 |
| 2017/0111037 A1* | 4/2017 | Shiigi | H01L 21/4853 |
| 2017/0236908 A1* | 8/2017 | Naito | G01K 13/00 257/48 |
| 2017/0263603 A1* | 9/2017 | Hata | H01L 29/7397 |
| 2017/0271452 A1* | 9/2017 | Nishimura | H01L 29/0634 |
| 2018/0061980 A1* | 3/2018 | Ohoka | H01L 27/088 |
| 2018/0151557 A1* | 5/2018 | Tanabe | H01L 29/739 |
| 2018/0197977 A1* | 7/2018 | Kouno | H01L 29/739 |
| 2018/0233571 A1* | 8/2018 | Akiyama | H01L 24/03 |
| 2018/0261666 A1* | 9/2018 | Zeng | H01L 29/42376 |
| 2018/0277638 A1* | 9/2018 | Hoshi | H01L 29/808 |

FOREIGN PATENT DOCUMENTS

| | | |
|---|---|---|
| JP | 2009-099690 A | 5/2009 |
| JP | 2009-268054 A | 11/2009 |
| JP | 2009-268336 A | 11/2009 |
| JP | 2013-198185 A | 9/2013 |
| JP | 2015-005866 A | 1/2015 |

* cited by examiner

SEMICONDUCTOR DEVICE HAVING A SENSE DIODE PORTION

The contents of the following Japanese patent application are incorporated herein by reference:
NO. 2017-075942 filed in JP on Apr. 6, 2017.

BACKGROUND

Technical Field

The present invention relates to a semiconductor device.

Related Art

Conventionally, a semiconductor device has been known, in which a sensing transistor element is provided in parallel with a main transistor element to detect currents flowing in the main transistor element such as an Insulated Gate Bipolar Transistor (IGBT) (for example, refer to Patent Document 1).
[Patent Document 1] Japanese Patent Application Publication No. 2009-99690

The sensing transistor element has a very small area occupying on a semiconductor substrate compared to the main transistor element. For this reason, a difference may occur in a gate capacity and the like and a timing of switching may be deviated in some cases. For this reason, even if the semiconductor device is normally operated, an excessive current may flow in the sensing transistor element in some cases.

SUMMARY

In a first aspect of the present invention, a semiconductor device including a semiconductor substrate is provided. The semiconductor device may include an upper-surface electrode that is provided on an upper surface of the semiconductor substrate. The semiconductor device may include a sensing electrode that is provided on the upper surface of the semiconductor substrate and is separated from the upper-surface electrode. The semiconductor device may include a lower-surface electrode that is provided on a lower surface of the semiconductor substrate. The semiconductor device may include a main transistor portion that is provided on the semiconductor substrate and is connected to the upper-surface electrode and the lower-surface electrode. The semiconductor device may include a main diode portion that is provided on the semiconductor substrate and is connected to the upper-surface electrode and the lower-surface electrode. The semiconductor device may include a sense diode portion that is provided on the semiconductor substrate and is connected to the sensing electrode and the lower-surface electrode.

The main transistor portion may have a drift region of a first conductivity type provided inside the semiconductor substrate. The main transistor portion may have a source region of the first conductivity type that is provided between the drift region and the upper surface of the semiconductor substrate and has an impurity concentration higher than that of the drift region. The main transistor portion may have a base region of a second conductivity type that is provided between the drift region and the source region. The main transistor portion may have a gate trench portion that is provided reaching the drift region from the upper surface of the semiconductor substrate and is provided extending along a predetermined extending direction in the upper surface of the semiconductor substrate. The main transistor portion may have a first well region that is provided overlapping an edge portion in the extending direction of the gate trench portion in the upper surface of the semiconductor substrate, is provided deeper than the edge portion of the gate trench portion from the upper surface of the semiconductor substrate, and has an impurity concentration higher than that of the base region. The sense diode portion may be provided on an outer side of the first well region.

The sense diode portion may have a second well region that is provided surrounding a predetermined region in the upper surface of the semiconductor substrate, is provided up to the inside of the semiconductor substrate from the upper surface of the semiconductor substrate, and has an impurity concentration higher than that of the base region.

The second well region may have the impurity concentration higher than that of the first well region. The second well region may be provided deeper than the first well region. The sense diode portion may have the drift region. In the region surrounded by the second well region in the upper surface of the semiconductor substrate, an anode region of the second conductivity type may be provided, which is provided between the upper surface of the semiconductor substrate and the drift region.

In the upper surface of the semiconductor substrate, a region of the first conductivity type may be provided to at least a partial region between the anode region and the second well region.

The semiconductor device may include an element separation portion that is provided between the first well region and the second well region in the upper surface of the semiconductor substrate, is provided from the upper surface of the semiconductor substrate to the inside of the semiconductor substrate, and suppresses a movement of a carrier from the main transistor portion and the main diode portion toward the sense diode portion.

The semiconductor device may include an edge termination structure portion provided surrounding the main transistor portion and the main diode portion on the upper surface of the semiconductor substrate. The sense diode portion may be arranged on the outer side of the edge termination structure portion on the upper surface of the semiconductor substrate. The sense diode portion may be arranged at a corner of the semiconductor substrate on the upper surface of the semiconductor substrate. The sense diode portion may be arranged on the inner side of the edge termination structure portion on the upper surface of the semiconductor substrate.

On the upper surface of the semiconductor substrate, a plurality of sense diode portions may be provided separately from each other.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

In the present specification, one side in a direction parallel with a depth direction of the semiconductor substrate is referred to as an "upper" one and the other side is referred to as a "lower" one. One surface of two main surfaces of a substrate, a layer, or another material is referred to as an upper surface and the other surface is referred to as a lower surface. The "upper" and "lower" directions are not limited to the gravity direction or directions at mounting of the semiconductor device.

In the present specification, technical matters are described by using orthogonal coordinate axes, i. e., an X-axis, a Y-axis, and a Z-axis. The orthogonal coordinate axes merely specify relative positions of components, and are not intended to limit to any particular direction. For example, the Z-axis does not indicate a direction limited to a height direction relative to the ground. It should be noted that the +Z-axis direction and the −Z-axis direction are directions opposite to each other. If the Z-axis direction is described without adding "+" or "−" signs, the Z-axis direction means a direction parallel with the +Z-axis and the −Z-axis.

Although examples are shown in which the first conductivity type is set as the N type and the second conductivity type is set as the P type in each embodiment, the first conductivity type may be set as the P type and the second conductivity type may be set as the N type. In this case, the conductivity types of the substrate, layers, regions, and the like in each embodiment are respectively of reverse polarities.

Figure 1:
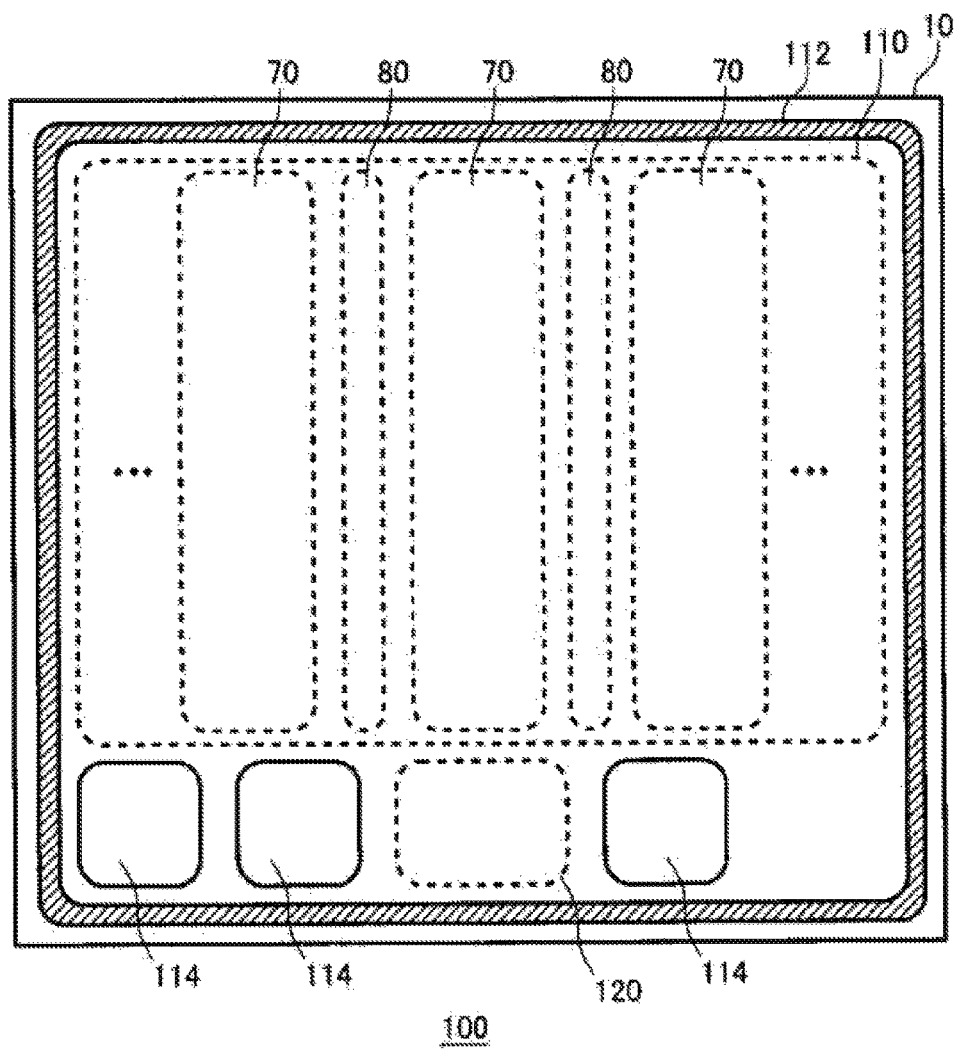
FIG. 1 is a top view showing one example of a semiconductor device 100 according to one embodiment of the present invention.

FIG. 1 is a top view showing one example of the semiconductor device 100 according to one embodiment of the present invention. The semiconductor device 100 includes a semiconductor substrate 10. The semiconductor device 100 of the present example is a semiconductor chip formed on the semiconductor substrate 10. In the present example, a plane parallel with an upper surface of the semiconductor substrate 10 is set as an X-Y plane, and a direction perpendicular to the X-Y plane (that is, a depth direction of the semiconductor substrate 10) is set as the Z-axis direction. The semiconductor substrate 10 of the present example is rectangular-shaped with sides parallel with the X-axis and sides parallel with the Y-axis in a top view.

The semiconductor device 100 includes a main element portion 110 and a sense diode portion 120 which are provided on the semiconductor substrate 10. The main element portion 110 is a region in which a main current flows between the upper surface and the lower surface of the semiconductor substrate 10 at the time of the operation of the semiconductor device 100, and has one or more main transistor portions 70 and one or more main diode portions 80.

Within the main transistor portion 70, a transistor element such as the IGBT is formed. Within the main diode portion 80, a diode element such as a freewheel diode (FWD) is formed. The main transistor portion 70 and the main diode portion 80 may be alternately arranged in the X-axis direction.

The sense diode portion 120 detects whether or not any node of a voltage in the main element portion 110 is in a predetermined voltage range. The sense diode portion 120 of the present example detects whether or not a collector voltage of the IGBT included in the main transistor portion 70 is in the predetermined voltage range. The collector voltage of the IGBT on a cathode terminal is applied to the sense diode portion 120 of the present example. A voltage is applied to an anode terminal of the sense diode portion 120 so that the sense diode portion 120 becomes to be in a forward bias at normal operation and the sense diode portion 120 becomes to be in a reverse bias if the collector voltage of the IGBT becomes equal to or greater than a predetermined value. Based on a state of the sense diode portion 120, it can be detected whether or not the collector voltage of the IGBT is equal to or greater than the predetermined value. Because the collector voltage of the IGBT rises as an overcurrent flows in the main transistor portion 70, the overcurrent can be detected by providing the sense diode portion 120.

Because the sense diode portion 120 does not perform a gate control, the deviation of the timing of switching with the main transistor portion 70 like the transistor element for sensing does not occur. Also, by setting the currents flowing in the sense diode portion 120 at the time of the forward bias small, a loss in the sense diode portion 120 can be very small.

Also, by forming the sense diode portion 120 to the same semiconductor substrate 10 as the semiconductor substrate 10 on which the main diode portion 80 is formed, the sense diode portion 120 can be formed in the same process as the process in which the main diode portion 80 is formed. Also, because a diode element for sensing may not be added to the outside of the semiconductor device 100, a number of components can be reduced.

Also, in a case of forming the sensing transistor, because a fine region such as an N+ type source region is to be formed, a variation of characteristics of the sensing transistor becomes large; on the other hand, because the fine source region and the like are not to be formed on the sense diode portion 120, the variation of characteristics can be reduced. Also, because it is easy to miniaturize the sense diode portion 120, it is easy to make the sense diode portion 120 built in the semiconductor device 100 even if the semiconductor device 100 is miniaturized.

The semiconductor device 100 of the present example includes one or more pads 114 on the upper surface of the semiconductor substrate 10. Each of the pads 114 is electrically connected to the main element portion 110 and the like. For example, any of the pads 114 is electrically connected to a gate electrode or an emitter electrode in the main diode portion 80. Also, any of the pads 114 may be electrically connected to a diode for temperature detection provided on the semiconductor substrate 10.

The semiconductor device 100 of the present example includes an edge termination structure portion 112 provided surrounding the main element portion 110 on the upper surface of the semiconductor substrate 10. The edge termination structure portion 112 has a guard ring, a field plate, or the like, and causes a depletion layer inside the semiconductor substrate 10 to be extended to an end portion of the semiconductor substrate 10. Accordingly, the withstand voltage of the semiconductor device 100 is improved.

In the present example, each of the pads 114 is arranged in a region surrounded by the edge termination structure portion 112 on the upper surface of the semiconductor substrate 10. The sense diode portion 120 may be arranged in a region surrounded by the edge termination structure portion 112 on the upper surface of the semiconductor substrate 10, or may be arranged on the outer side of the edge termination structure portion 112. In the example of FIG. 1, the sense diode portion 120 is arranged in a region surrounded by the edge termination structure portion 112 on the upper surface of the semiconductor substrate 10.

Figure 2:
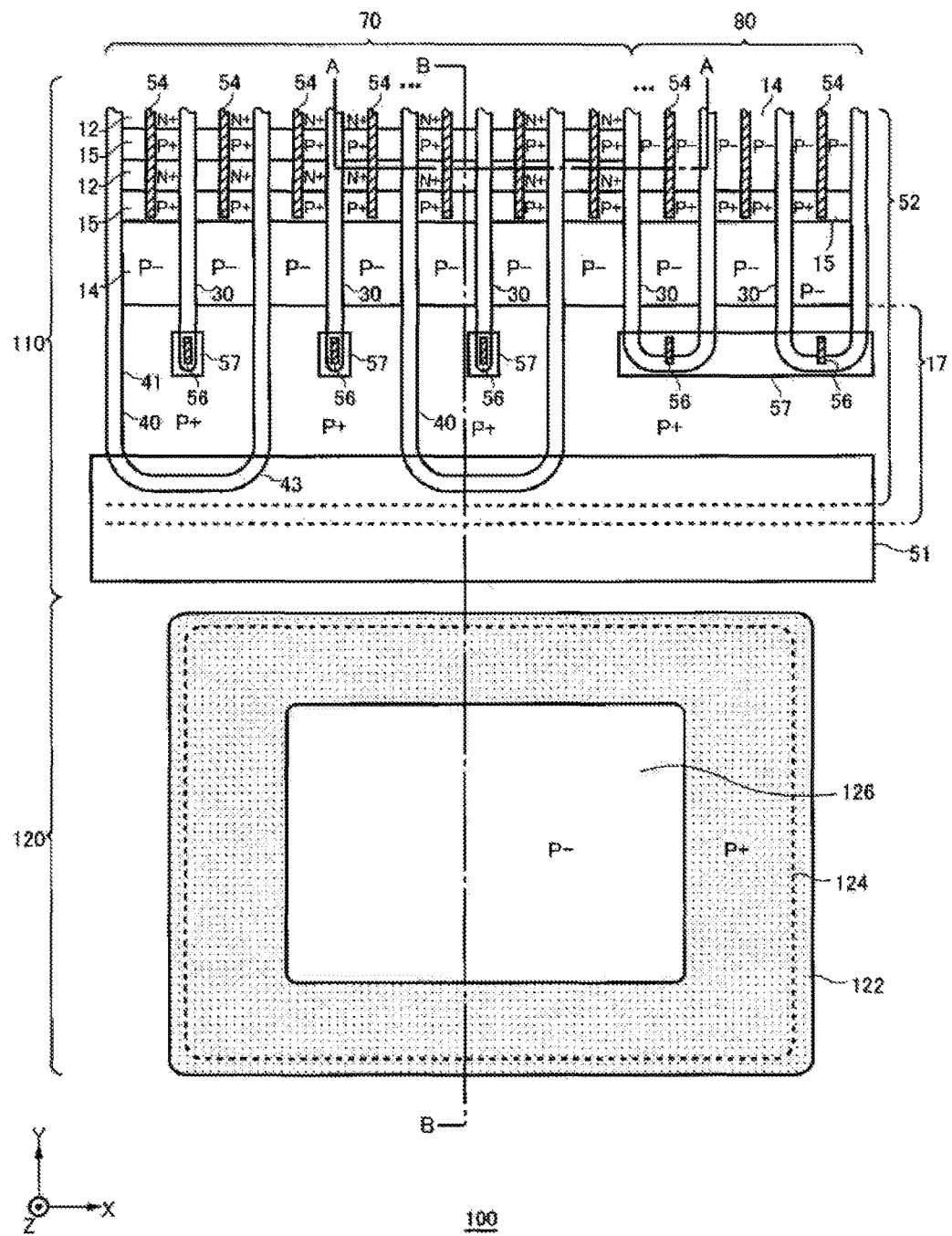
FIG. 2 is a drawing partially showing an upper surface of the semiconductor substrate 10.

FIG. 2 is a drawing partially showing the upper surface of the semiconductor substrate 10. The semiconductor device 100 of the present example includes, in the main element portion 110, a gate trench portion 40, a dummy trench portion 30, a source region 12, a base region 14, a contact region 15, and a first well region 17, which are provided inside the semiconductor substrate 10. Also, the semiconductor device 100 of the present example includes an emitter electrode 52 provided above the upper surface of the semiconductor substrate 10 and a gate wiring portion 51. The emitter electrode 52 is formed of a conductive material such as aluminum. The gate wiring portion 51 is formed of a conductive material such as polysilicon doped with impurities.

Although an insulating film is provided between the emitter electrode 52 and the gate wiring portion 51, and between the emitter electrode 52 and the upper surface of the semiconductor substrate 10, it is omitted in FIG. 2. In the present example, a contact hole 54 and a contact hole 56 are provided penetrating through the insulating film.

The emitter electrode 52 passes through the contact hole 54 and the like and comes in contact with the source region 12, the contact region 15, the base region 14, and the first well region 17 on the upper surface of the semiconductor substrate 10. The contact hole 54 of the present example is provided between each of the trench portions arrayed along the X-axis direction. Also, the emitter electrode 52 is connected to a dummy conductive portion within the dummy trench portion 30 through the contact hole 56. Between the emitter electrode 52 and the dummy conductive portion, a connection portion 57 formed of a material having conductivity, such as polysilicon doped with the impurities, may be provided. The connection portion 57 is provided on the upper surface of the semiconductor substrate 10 with the insulating film, such as a thermal oxide film, in between. The contact hole 56 in the present example is arranged in an edge of the dummy trench portion 30 in the Y-axis direction.

Between the gate wiring portion 51 and the semiconductor substrate 10, the insulating film such as the thermal oxide film is provided. The gate wiring portion 51 is connected to the gate conductive portion, which is within the gate trench portion 40, in the upper surface of the semiconductor substrate 10. The gate wiring portion 51 is not connected to the dummy conductive portion which is within the dummy trench portion 30.

One or more gate trench portions 40 and one or more dummy trench portions 30 are arrayed at a predetermined interval along the X-axis direction in the upper surface of the semiconductor substrate 10. In the main transistor portion 70, the one or more gate trench portions 40 and the one or more dummy trench portions 30 are arranged alternately along the X-axis direction. In the main diode portion 80, the one or more dummy trench portions 30 are arranged along the X-axis direction.

The gate trench portion 40 of the present example may have a straight portion 41 that extends straightly along the Y-axis direction, and an edge portion 43 that is respectively connected to two straight portions 41 on edges of the two straight portions 41. It is preferable that at least a part of the edge portion 43 is formed in a curved shape on the upper surface of the semiconductor substrate 10. By connecting the edges of the two straight portions 41 of the gate trench portion 40 to each other by the edge portion 43, an electric field concentration on the end portion of the straight portion 41 can be relaxed.

The one or more dummy trench portions 30 are provided between the respective straight portions 41 of the gate trench portion 40. The dummy trench portions 30 may be in a U shape having two straight portions and an edge portion, similar to the gate trench portion 40, or the dummy trench portions 30 may be in a straight shape only having the straight portion without the edge portion, or the dummy trench portions 30 in the U shape and the dummy trench portions 30 in the straight shape may exist together. The dummy trench portion 30 is provided at a position not overlapping the gate wiring portion 51.

On the upper surface of the semiconductor substrate 10, the base region 14 of the second conductivity type is provided in a region sandwiched by the straight portions of each of the trench portions. The base region 14 of the present example is P− type. In an upper surface of the base region 14, a contact region 15 of the second conductivity type (P+ type in the present example) having a doping concentration higher than that of the base region 14 is selectively provided.

In the upper surface of the base region 14 in the main transistor portion 70, the source region 12 of the first conductivity type is selectively formed. The source region 12 of the present example is N+ type. In the present example, the contact region 15 and the source region 12 of the main transistor portion 70 are provided so as to be alternately exposed on the upper surface of the semiconductor substrate 10 along the Y-axis direction. However, the arrangement of the contact region 15 and the source region 12 is not limited to this. The source region 12 may be arranged along the straight portion 41 of the gate trench portion 40. In the main diode portion 80, the source region 12 is not formed.

The first well region 17 is provided overlapping the edge portion 43 of the gate trench portion 40 in the upper surface of the semiconductor substrate 10. That is, in a plane parallel with the upper surface of the semiconductor substrate 10, the edge portion 43 of the gate trench portion 40 is arranged within the region in which the first well region 17 is provided. Among the edge portions 43, the top end portion at least in the Y-axis direction is arranged overlapping the first well region 17. The first well region 17 of the present example is the P+ type region having an impurity concentration higher than that of the base region 14.

The first well region 17 may be provided so as to surround all of the gate trench portions 40 and all of the dummy trench portions 30 in the upper surface of the semiconductor substrate 10. All of the source regions 12 may be arranged within the region surrounded by the first well region 17 in the upper surface of the semiconductor substrate 10.

The sense diode portion 120 of the present example is provided on an outer side of the first well region 17 on the upper surface of the semiconductor substrate 10. The outer side of the first well region 17 may refer to a region that is on the opposite side to the source region 12 with the first well region 17 in between on the upper surface of the semiconductor substrate 10. If the first well region 17 is provided surrounding a predetermined region on the upper surface of the semiconductor substrate 10, the outer side of the first well region 17 may refer to a region which is not surrounded by the first well region 17.

The sense diode portion 120 of the present example has an anode region 126 of the second conductivity type (P− type in the present example) that is exposed on the upper surface of the semiconductor substrate 10. The anode region 126 and the drift region of the first conductivity type, which is formed inside the semiconductor substrate 10, form a PN junction. In another example, the sense diode portion 120 may be a Schottky diode.

on the upper surface of the semiconductor substrate 10, the sensing electrode 124, which is in contact with the anode region 126, is provided separately from the emitter electrode 52. The sensing electrode 124 is formed of the conductive material such as aluminum. The sense diode portion 120 may have a second well region 122 provided surrounding the anode region 126 on the upper surface of the semiconductor substrate 10. The second well region 122 is of the second conductivity type (P+ type in the present example) having the impurity concentration higher than that of any of the anode region 126 and the base region 14.

Figure 3:
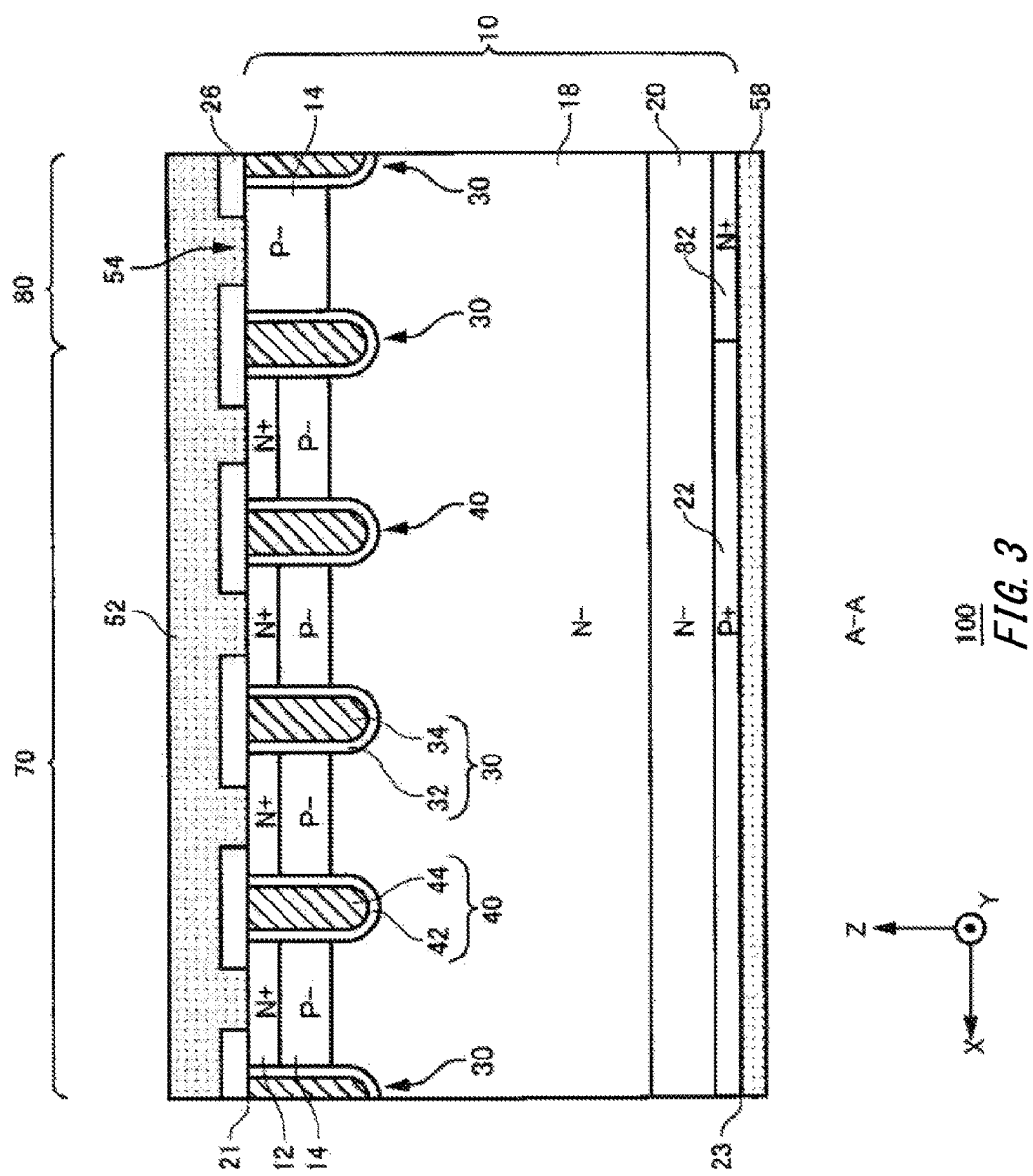
FIG. 3 is a drawing showing one example of a cross section taken along line A-A in FIG. 2.

FIG. 3 is a drawing showing one example of the cross section taken along line A-A in FIG. 2. The cross section taken along line A-A of the present example is an X-Z plane passing through the source region 12 in the main element portion 110. The semiconductor device 100 of the present example has the semiconductor substrate 10, the insulating film 26, the emitter electrode 52, and the collector electrode 58 in the cross section. The collector electrode 58 may be formed of the same material as the material of which the emitter electrode 52 is formed. The emitter electrode 52 is one example of the upper-surface electrode, and the collector electrode 58 is one example of the lower-surface electrode. The main transistor portion 70 and the main diode portion 80 formed on the semiconductor substrate 10 are connected to the emitter electrode 52 and the collector electrode 58.

The insulating film 26 is, for example, silicate glass into which impurities, such as boron and phosphorus, are added. The insulating film 26 is selectively formed on the upper surface 21 of the semiconductor substrate 10. The emitter electrode 52 is provided above the upper surface of the semiconductor substrate 10. The insulating film 26 is provided between the emitter electrode 52 and the semiconductor substrate 10. The emitter electrode 52 is in contact with the semiconductor substrate 10 via a through hole provided in the insulating film 26. The collector electrode 58 is provided to the lower surface 23 of the semiconductor substrate 10. The collector electrode 58 may be provided in contact with the lower surface 23 of the semiconductor substrate 10. The collector electrode 58 may be provided over the entire lower surface 23 of the semiconductor substrate 10.

The semiconductor substrate 10 may be a silicon substrate, or may be a silicon carbide substrate, or may be a nitride semiconductor substrate such as gallium nitride, and the like. The semiconductor substrate 10 of the present example is the silicon substrate.

An N− type drift region 18 is provided inside the semiconductor substrate 10. The N+ type source region 12 having the impurity concentration higher than that of the drift region 18 is provided between the drift region 18 and the upper surface 21 of the semiconductor substrate 10 on the cross section. The P− type base region 14 is provided between the source region 12 and the drift region 18 in the cross section. The drift region 18 in the cross section is the remaining region, in which the source region 12, the base region 14, the buffer region 20, the collector region 22, and the cathode region 82 are not formed, of the semiconductor substrate 10.

The base region 14 may be formed by implanting of P type impurities, such as boron, from the upper surface of the semiconductor substrate 10. The source region 12 may be formed by implanting N type impurities, such as phosphorus or arsenic, from the upper surface of the semiconductor substrate 10.

The gate trench portion 40 is formed from the upper surface 21 of the semiconductor substrate 10 to the inside of the semiconductor substrate 10 and comes in contact with the source region 12 and the base region 14 at a side wall of the gate trench portion 40. The gate trench portion 40 of the present example is provided penetrating through the source region 12 and the base region 14 from the upper surface 21 of the semiconductor substrate 10.

The dummy trench portion 30 is formed from the upper surface 21 of the semiconductor substrate 10 to the inside of the semiconductor substrate 10, and comes in contact with the base region 14 at its side wall. A side wall opposite to the gate trench portion 40 among side walls of the dummy trench portion 30 may be in contact with the source region 12 and the base region 14.

The buffer region 20 is formed on the lower-surface side of the drift region 18. The doping concentration of the buffer region 20 is higher than the doping concentration of the drift region 18. The buffer region 20 may serve as a field stop layer to prevent the depletion layer, which spreads from the lower-surface side of the base region 14, from reaching the P+ type collector region 22.

A P+ type collector region 22 is formed on the lower-surface side of the buffer region 20 in the main transistor portion 70. An N+ type cathode region 82 is formed on the lower-surface side of the buffer region 20 in the main diode portion 80.

The gate trench portion 40 has a gate insulating film 42 and a gate conductive portion 44. The gate insulating film 42 is formed covering an inner wall of the gate trench. The gate insulating film 42 may be formed by oxidizing or nitriding semiconductors on the inner wall of the gate trench. The gate conductive portion 44 is covered by the gate insulating film 42 inside the gate trench. That is, the gate insulating film 42 insulates the gate conductive portion 44 from the semiconductor substrate 10. The gate conductive portion 44 is formed of the conductive material such as polysilicon.

The gate conductive portion 44 includes a region at least opposite to the adjacent base region 14 with the gate insulating film 42 in between in the depth direction. The gate trench portion 40 in the cross section is covered by the insulating film 26 in the upper surface of the semiconductor substrate 10. As a predetermined voltage is applied to the gate conductive portion 44, a channel according to an inversion layer of electrons is formed in a surface layer of an interface in contact with the gate trench portion 40 of the base region 14.

The dummy trench portion 30 of the present example has a dummy insulating film 32 and a dummy conductive portion 34. The dummy insulating film 32 is formed covering the inner wall of the dummy trench. The dummy conductive portion 34 is formed inside the dummy trench portion 30, and is covered by the dummy insulating film 32. The dummy insulating film 32 insulates the dummy conductive portion 34 from the semiconductor substrate 10. The dummy conductive portion 34 may be formed of the same material as the material of which the gate conductive portion 44 is formed. The dummy trench portion 30 in the cross section is covered by the insulating film 26 on the upper surface of the semiconductor substrate 10.

By providing the dummy trench portion 30, a carrier storage effect can be increased, a conductivity modulation can be promoted, and an ON voltage can be reduced. Also, by adjusting a proportion of the dummy trench portion 30 to the gate trench portion 40, the switching speed of the semiconductor device 100 can be adjusted.

Figure 4:
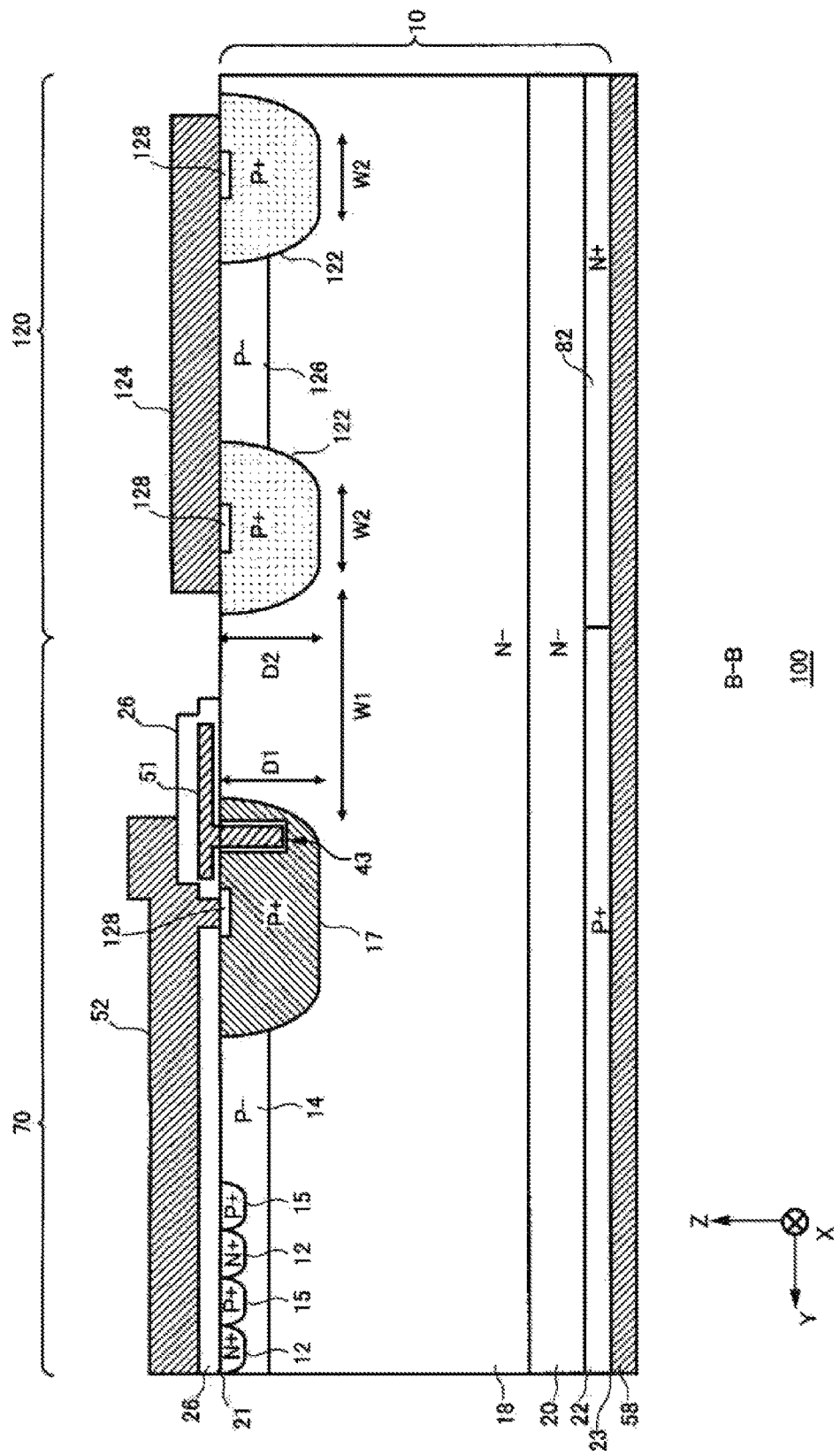
FIG. 4 is a drawing showing one example of a cross section taken along line B-B in FIG. 2.

FIG. 4 is a drawing showing one example of the cross section taken along line B-B in FIG. 2. The cross section taken along line B-B of the present example is a cross section that crosses the entire sense diode portion 120 and a part of the main transistor portion 70 and is parallel with the Y-Z plane.

The emitter electrode 52 is arranged above the main element portion 110. The insulating film 26 is provided between the emitter electrode 52 and the semiconductor substrate 10. A through hole is formed in the insulating film 26, and the emitter electrode 52 and the semiconductor substrate 10 are in contact with each other via the through hole. In the cross section, the emitter electrode 52 and the first well region 17 are in contact with each other. In the region of the first well region 17 in contact with the emitter electrode 52, a P type Ohmic region 128 having an impurity concentration higher than that of the first well region 17 may be provided. The Ohmic region 128 may also be provided in a second well region 122 that is described later.

As shown in FIG. 2, the first well region 17 is provided surrounding the edge portion 43 of the gate trench portion 40 in the X-Y plane. Also, as shown in FIG. 4, in the Y-Z plane as well, the first well region 17 is provided surrounding the edge portion 43 of the gate trench portion 40. The first well region 17 is formed up to deeper than the edge portion 43 of the gate trench portion 40 in the Z-axis direction.

The base region 14 is formed on the inner side of the first well region 17 (on the positive Y-axis side in the present example). In the cross section, the contact region 15 and the source region 12 are alternately formed in the upper surface of the base region 14.

A sensing electrode 124 separated from the emitter electrode 52 is provided on the upper surface 21 of the semiconductor substrate 10 in the sense diode portion 120. The sensing electrode 124 is formed of the conductive material such as aluminum. The sensing electrode 124 may be provided in contact with the upper surface 21 of the semiconductor substrate 10. The sensing electrode 124 of the present example is electrically connected to the second well region 122 and the anode region 126 of the sense diode portion 120. The anode region 126 is provided between the upper surface 21 of the semiconductor substrate 10 and the drift region 18.

In the sense diode portion 120, a cathode region 82 is provided, which is exposed on the lower surface 23 of the semiconductor substrate 10. The cathode region 82 of the sense diode portion 120 may have the same impurity concentration as that of the cathode region 82 of the main diode portion 80, and may be provided at the same depth position as the depth position at which the cathode region 82 of the main diode portion 80 is arranged.

The cathode region 82 is electrically connection to the collector electrode 58. That is, the sense diode portion 120 of the present example is connected to the collector electrode 58 shared with the main element portion 110.

If the collector voltage of the collector electrode 58 exceeds a voltage which has been applied to the sensing electrode 124, the sense diode portion 120 of the present example becomes to be in a reverse bias state. Accordingly, it can be detected whether or not the collector voltage of the main transistor portion 70 exceeds a predetermined threshold voltage.

Also, by providing the second well region 122 so as to surround the anode region 126 of the sense diode portion 120, a hole from the collector region 22 and the like of the main transistor portion 70 can be suppressed from reaching the anode region 126. Accordingly, the withstand voltage of the sense diode portion 120 can be improved. The second well region 122 is provided from the upper surface 21 of the semiconductor substrate 10 to the inside of the semiconductor substrate 10.

It is preferable that the impurity concentration, a depth D2, and a width W2 of the second well region 122 are set so that the withstand voltage of the sense diode portion 120 becomes slightly greater than the withstand voltage of the main transistor portion 70. Accordingly, a breakdown of the sense diode portion 120 can be suppressed from occurring earlier than the main transistor portion 70, and the currents can be suppressed from concentrating in the sense diode portion 120 that has a relatively small area can be suppressed. It is further preferable that a third well region and a fourth well region are provided on the outer side than the second well region 122 within the sense diode portion 120.

Because the sense diode portion 120 and the main transistor portion 70 are formed on the same semiconductor substrate 10, the withstand voltages are approximately the same. On the other hand, by providing the second well region 122, the withstand voltage of the sense diode portion 120 can be improved. The withstand voltage of the second well region 122 is improved as a distance W1 between the second well region 122 and the first well region 17 is larger.

Also, the depth D2 of the second well region 122 may be deeper than a depth D1 of the first well region 17, or may be the same as the depth D1 of the first well region 17. The depth of each region refers to a distance from the upper surface 21 of the semiconductor substrate 10 to the bottom of each region in the Z-axis direction.

By deeply forming the second well region 122, the carrier can be suppressed from flowing from the main element portion 110 to the anode region 126. Accordingly, an influence on the operation of the sense diode portion 120 exercised by the operation of the main element portion 110 can be reduced.

Also, the impurity concentration of the second well region 122 may be the same as, or may be lower than, or may be higher than the impurity concentration of the first well region 17. By setting the impurity concentration of the second well region 122 high, the influence on the operation of the sense diode portion 120 exercised by the operation of the main element portion 110 can be reduced.

Also, the impurity concentration of the second well region 122 is higher than the impurity concentration of the anode region 126. As one example, the impurity concentration of the second well region 122 is equal to or greater than $1.0\times10^{13}/cm^3$ and equal to or less than $1.0\times10^{17}/cm^3$. The impurity concentration of the anode region is equal to or greater than $1.0\times10^{13}/cm^3$ and equal to or less than $1.0\times10^{16}/cm^3$.

Figure 5:
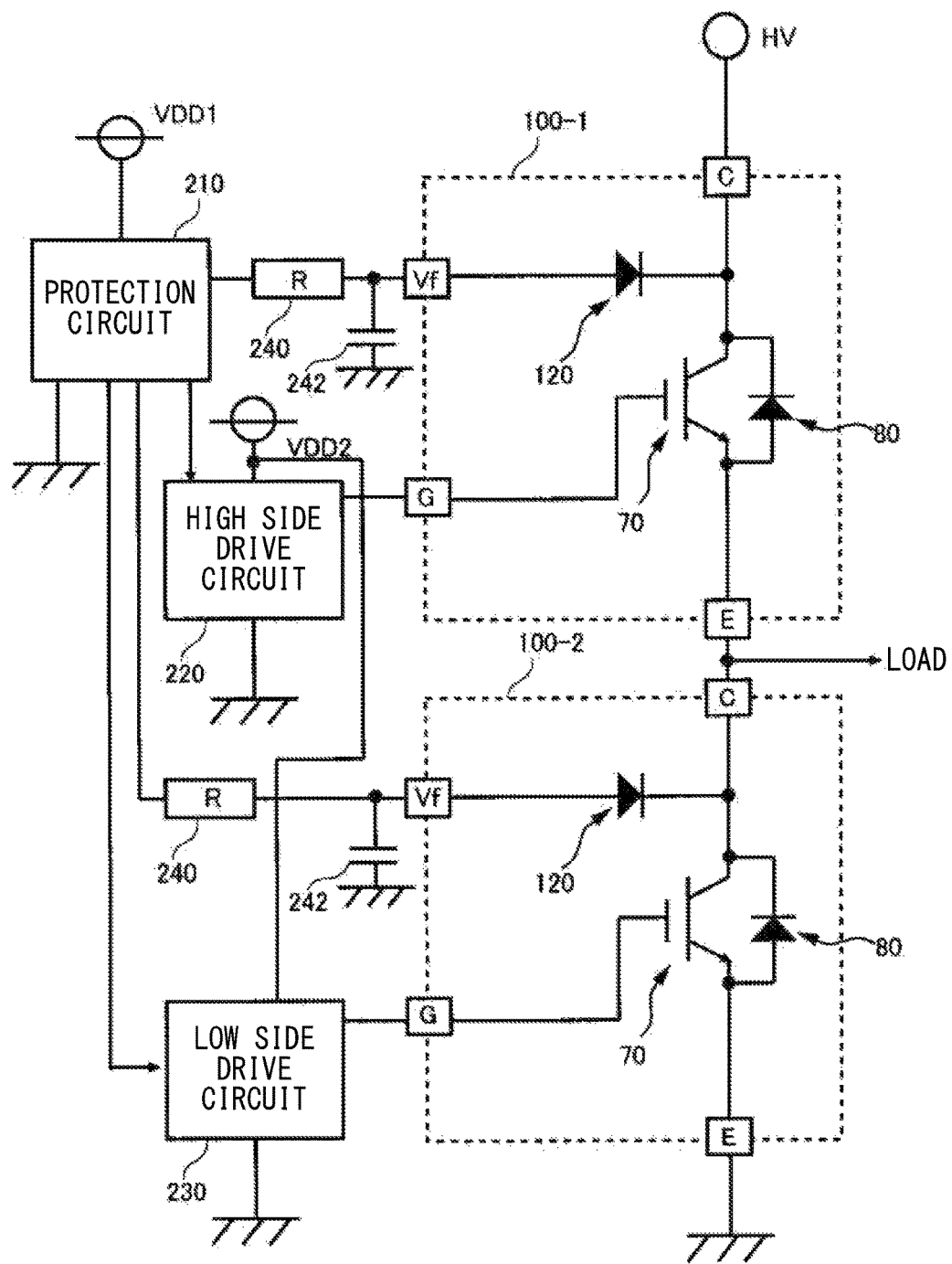
FIG. 5 is a drawing showing one example of an output device 200 including semiconductor devices 100.

FIG. 5 is a drawing showing one example of an output device 200 including semiconductor devices 100. The output device 200 of the present example includes a semiconductor device 100-1 and a semiconductor device 100-2, a protection circuit 210, a high side drive circuit 220, and a low side drive circuit 230.

Each of the semiconductor devices 100 includes a collector terminal C, an emitter terminal E, a gate terminal G, and a sense terminal Vf. The collector terminal C is electrically connected to the collector electrode 58, the emitter terminal E is electrically connected to the emitter electrode 52, the gate terminal G is electrically connected to the gate conductive portion 44 of the gate trench portion 40, and the sense terminal Vf is electrically connected to the sensing electrode 124.

A predetermined high voltage HV is applied to the collector terminal C of the semiconductor device 100-1. The emitter terminal E of the semiconductor device 100-1 is connected to the collector terminal C of the semiconductor device 100-2. A predetermined reference voltage (a ground voltage in the present example) is applied to the emitter terminal E of the semiconductor device 100-2. The emitter terminal E of the semiconductor device 100-1 is connected to a load.

The high side drive circuit 220 is connected to the gate terminal G of the semiconductor device 100-1 to control the semiconductor device 100-1. The low side drive circuit 230 is connected to the gate terminal G of the semiconductor device 100-2 to control the semiconductor device 100-2. As one example, one of the main transistor portions 70 of the semiconductor device 100-1 and of the semiconductor device 100-2 is controlled into an ON state, and the other one is controlled into an OFF state. Accordingly, a predetermined voltage and current are supplied to the load.

The sense diode portion 120 becomes to be in the forward bias at normal operation and if the voltage of the collector terminal C becomes equal to or greater than the predetermined value, the protection circuit 210 applies, to the sense terminal Vf, a voltage by which the sense diode portion 120 becomes to be in the reverse bias. That is, the protection circuit 210 applies, to the sense terminal Vf, a voltage larger than the collector voltage of the sense diode portion 120 at normal operation. The protection circuit 210 may be connected to the sense terminal Vf via the resistance 240. By providing the resistance 240, the currents flowing in the sense diode portion 120 can be made minute. Also, a capacity 242 is connected to a path that connects the protection circuit 210 to the sense terminal Vf.

Figure 6:
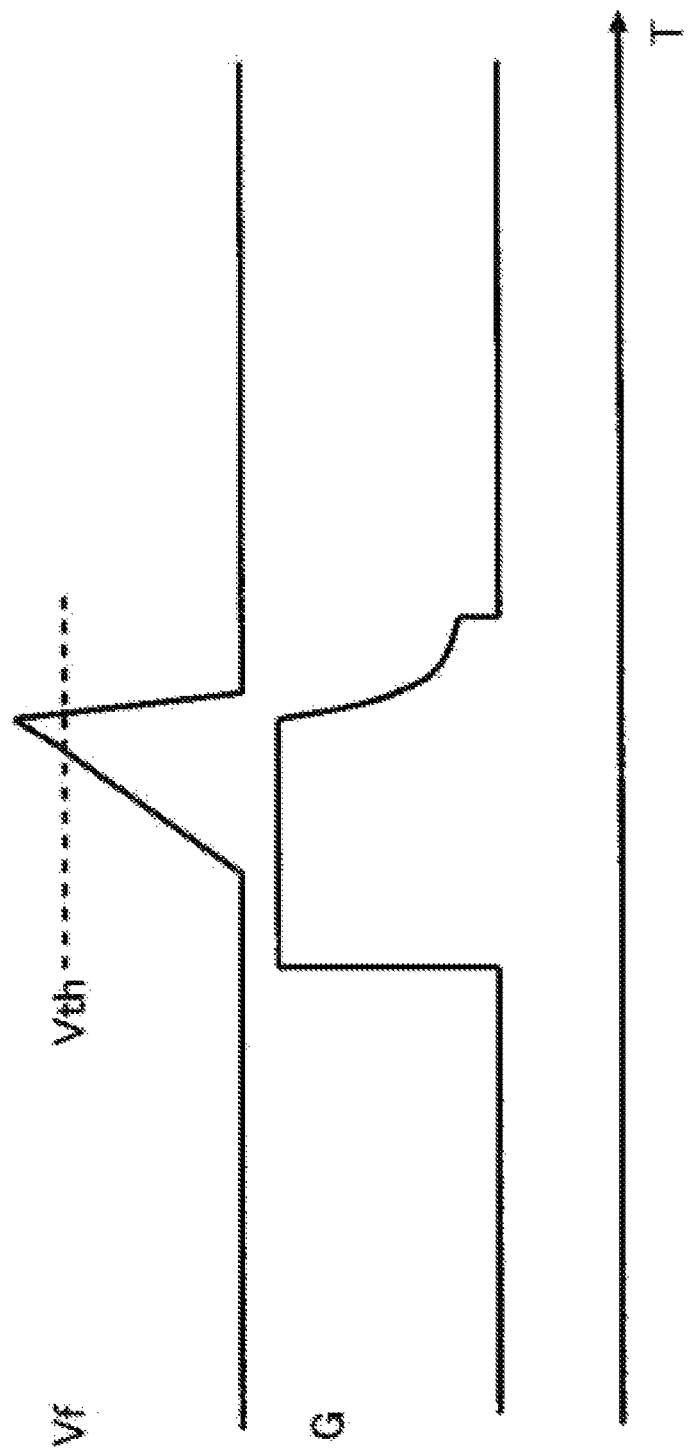
FIG. 6 is a drawing showing an operation example of any of semiconductor devices 100.

FIG. 6 is a drawing showing an operation example of any of the semiconductor devices 100. At normal operation, the sense diode portion 120 becomes to be in the forward bias, and a minute current flows in the sense diode portion 120 from the protection circuit 210. The current is approximately several mA, for example, and is sufficiently small to the extent of being negligible compared to the collector current of the semiconductor device 100. For this reason, the loss in the sense diode portion 120 becomes very small.

If a short-circuit state in which the main transistor portions 70 in both of the semiconductor device 100-1 and the semiconductor device 100-2 become to be in the ON state due to an error signal and the like, a large collector current flows in each of the main transistor portions 70. As the large collector current flows, the collector voltage of each of the main transistor portions 70 rises.

As the collector voltage becomes to be equal to or greater than the predetermined voltage, the sense diode portion 120 becomes to be in the reverse bias state and the current becomes not to flow in the sense diode portion 120. For this reason, the current output by the protection circuit 210 starts to flow in the capacity 242, and the capacity 242 is charged. Accordingly, the voltage of the sense terminal Vf rises more than the voltage at normal operation.

If the voltage of any of the sense terminals Vf exceeds a predetermined threshold voltage Vth determined relative to each of the sense terminals Vf, the protection circuit 210 controls the main transistor portion 70 of the corresponding semiconductor device 100 to be into the OFF state. The protection circuit 210 of the present example outputs a signal for controlling the main transistor portion 70 to be into the OFF state to the high side drive circuit 220 and the low side drive circuit 230. According to the signal, the voltage of the gate terminal G drops and the main transistor portion 70 becomes to be in the OFF state. For this reason, the overcurrent is blocked and the semiconductor device 100 can be protected.

Figure 7:
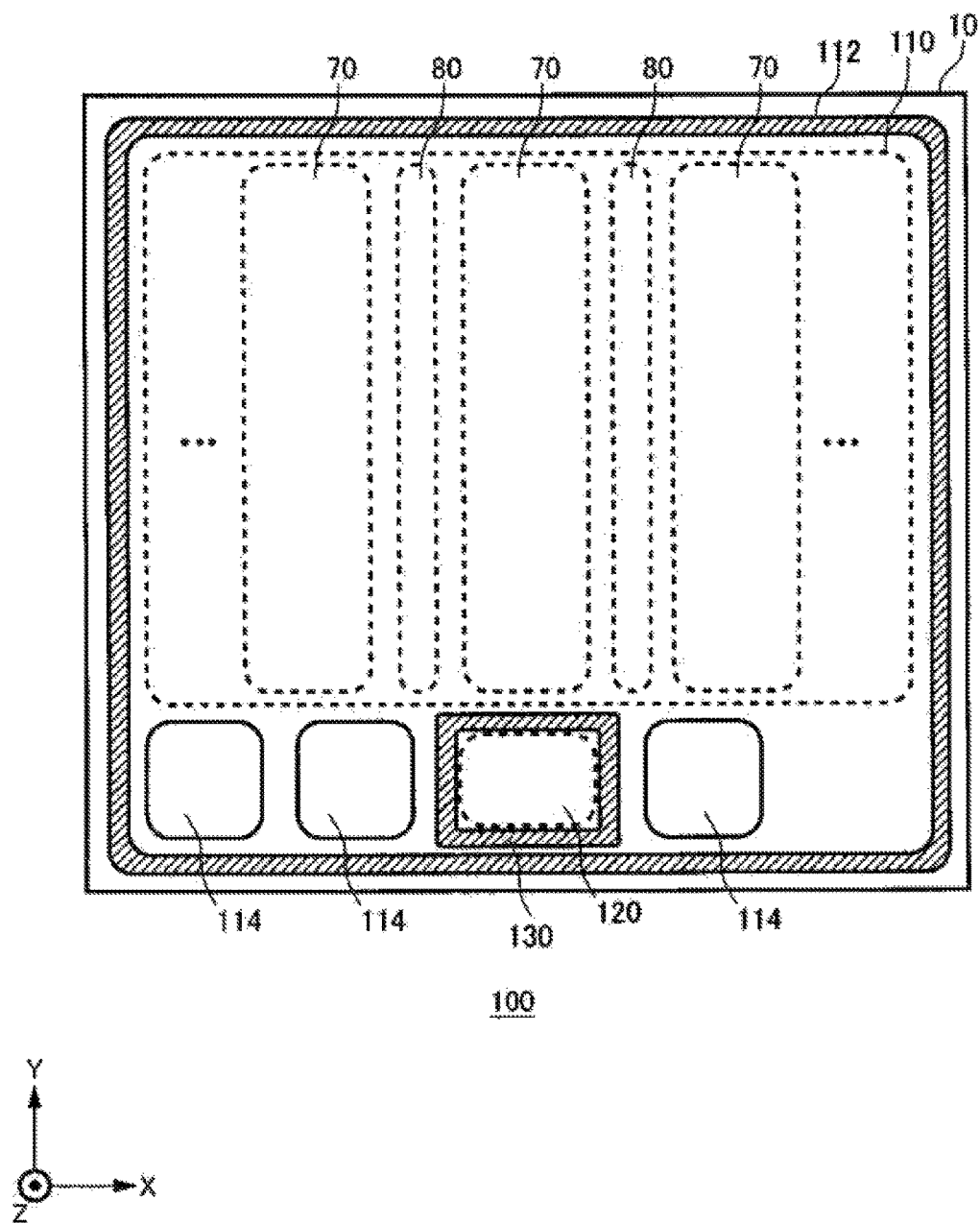
FIG. 7 is a top view showing another example of the semiconductor device 100.

FIG. 7 is a top view showing another example of the semiconductor device 100. The semiconductor device 100 of the present example further includes an element separation portion 130, in addition to the configuration of the semiconductor device 100 described in FIG. 1 to FIG. 6. Other configurations are the same as those of the semiconductor device 100 in any of the aspects described in FIG. 1 to FIG. 6.

The element separation portion 130 is provided between the main element portion 110 and the sense diode portion 120 in the upper surface of the semiconductor substrate 10, and suppresses a movement of a carrier between the main element portion 110 and the sense diode portion 120. Although the element separation portion 130 is provided surrounding the sense diode portion 120 in the upper surface of the semiconductor substrate 10 in the example of FIG. 7, the element separation portion 130 may not surround the sense diode portion 120. The element separation portion 130 may be provided straightly extending in the X-axis direction between the main element portion 110 and the sense diode portion 120 in the upper surface of the semiconductor substrate 10. In this case, it is preferable that a length of the element separation portion 130 in the X-axis direction is longer than a length of the sense diode portion 120 in the X-axis direction.

Figure 8:
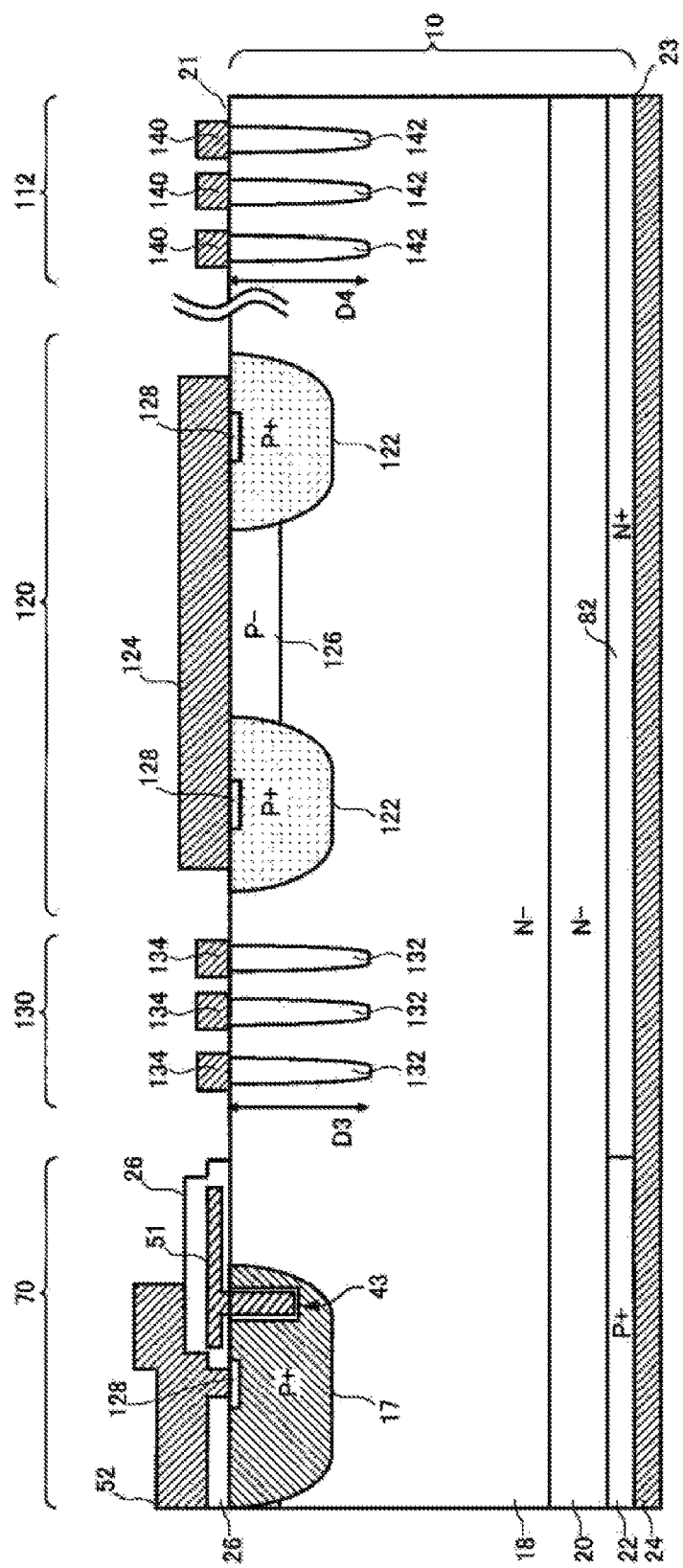
FIG. 8 is a drawing showing one example of a Y-Z cross section in the semiconductor device 100 shown in FIG. 7.

FIG. 8 is a drawing showing one example of a Y-Z cross section of the semiconductor device 100 shown in FIG. 7. The Y-Z cross section in FIG. 8 is a cross section crossing a part of the main transistor portion 70, the element separation portion 130, the sense diode portion 120, and the edge termination structure portion 112.

The element separation portion 130 of the present example is provided between the first well region 17 and the second well region 122. The element separation portion 130 of the present example has one or more guard rings 132. The guard ring 132 is provided from the upper surface 21 of the semiconductor substrate 10 to the inside of the semiconductor substrate 10. It should be noted that if the element separation portion 130 is formed straightly in the upper surface of the semiconductor substrate 10, the guard ring 132 is not formed in a ring shape.

The guard ring 132 suppresses a movement of the carrier between the main element portion 110 and the sense diode portion 120. The guard ring 132 may be a P type region. Also, the guard ring 132 may be a trench filled with an insulating material. The guard ring 132 may be formed up to deeper than the second well region 122.

The edge termination structure portion 112 of the present example has one or more guard rings 142 and one or more field plates 140. The guard ring 142 is a P type region provided from the upper surface 21 of the semiconductor substrate 10 to the inside of the semiconductor substrate 10. The field plate 140 is provided to the upper surface 21 of the semiconductor substrate 10, and is connected to an upper end of the guard ring 142. The field plate 140 is formed of a conductive material. Also, in the upper surface 21 of the semiconductor substrate 10, the field plate 134 may be provided, which is connected to the upper end of the guard ring 132 and is formed of the conductive material.

A depth D3 in which the guard ring 132 of the element separation portion 130 has been formed may be the same as or may be deeper than a depth D4 in which the guard ring 142 of the edge termination structure portion 112 has been formed. By forming the guard ring 132 deeply, the main element portion 110 can be separated much more from the sense diode portion 120. However, if the withstand voltage of the sense diode portion 120 may be equal to the withstand voltage of the main transistor portion 70, D3 may be shallower than D4.

Also, a number of the guard rings 132 of the element separation portion 130 may be less than a number of the guard rings 142 of the edge termination structure portion 112. In the element separation portion 130, because the depletion layer may not be extended in the Y-axis direction, the number of the guard rings 132 arrayed in the Y-axis direction may be small. By setting the number of the guard rings 132 small, the semiconductor device 100 can be miniaturized.

Figure 9:
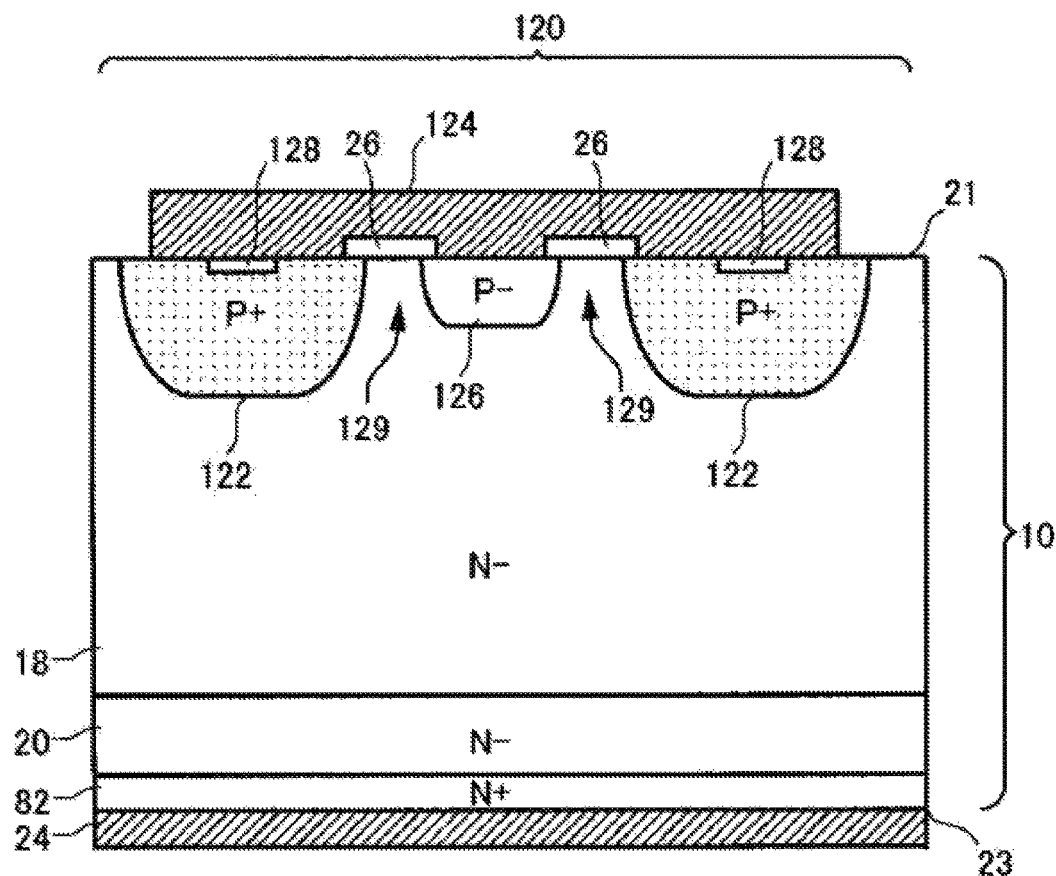
FIG. 9 is a cross sectional view showing another example of a sense diode portion 120.

FIG. 9 is a cross sectional view showing another example of the sense diode portion 120. In the sense diode portion 120 of the present example, an N type region 129 is provided in at least a partial region between the anode region 126 and the second well region 122 on the upper surface 21 of the semiconductor substrate 10. That is, the area of the anode region 126 in the upper surface 21 of the semiconductor substrate 10 may be smaller than the area surrounded by the second well region 122. By setting the area of the anode region 126 small, the operation of the sense diode portion 120 can be accelerated.

The region 129 may be provided so as to surround the anode region 126 on the upper surface 21 of the semiconductor substrate 10. The region 129 may have the same impurity concentration as that of the drift region 18. Also, on the upper surface 21 of the semiconductor substrate 10, the insulating film 26 is provided, which insulates the region 129 from the sensing electrode 124. A width of the anode region 126 in the Y-axis direction may be equal to or less than half of an interval between the second well regions 122.

Figure 10:
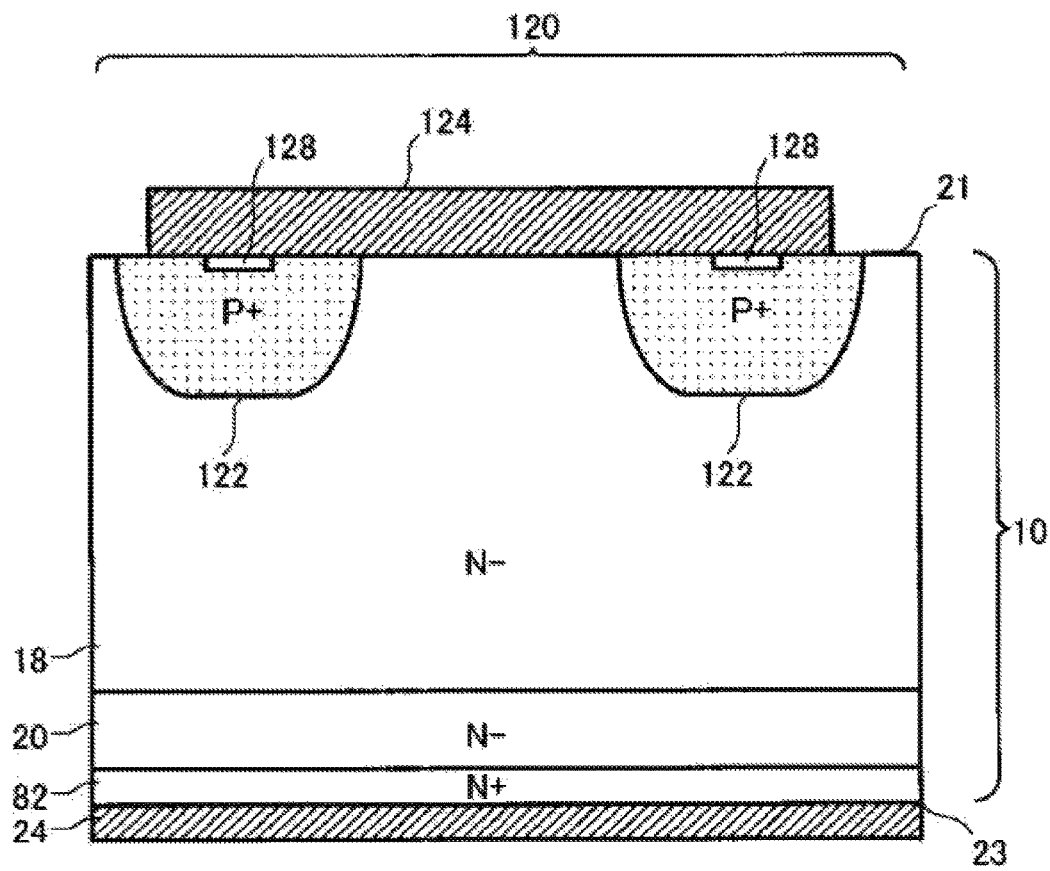
FIG. 10 is a cross sectional view showing another example of the sense diode portion 120.
Figure 10:
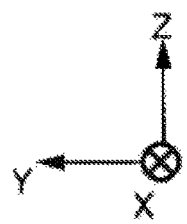

FIG. 10 is a cross sectional view showing another example of the sense diode portion 120. The sense diode portion 120 of the present example does not have any P type anode region 126. The drift region 18 is exposed on a region surrounded by the second well region 122 on the upper surface 21 of the semiconductor substrate 10. The sensing electrode 124 is in Schottky-contact with the drift region 18. That is, the sense diode portion 120 serves as a Schottky diode.

Figure 11:
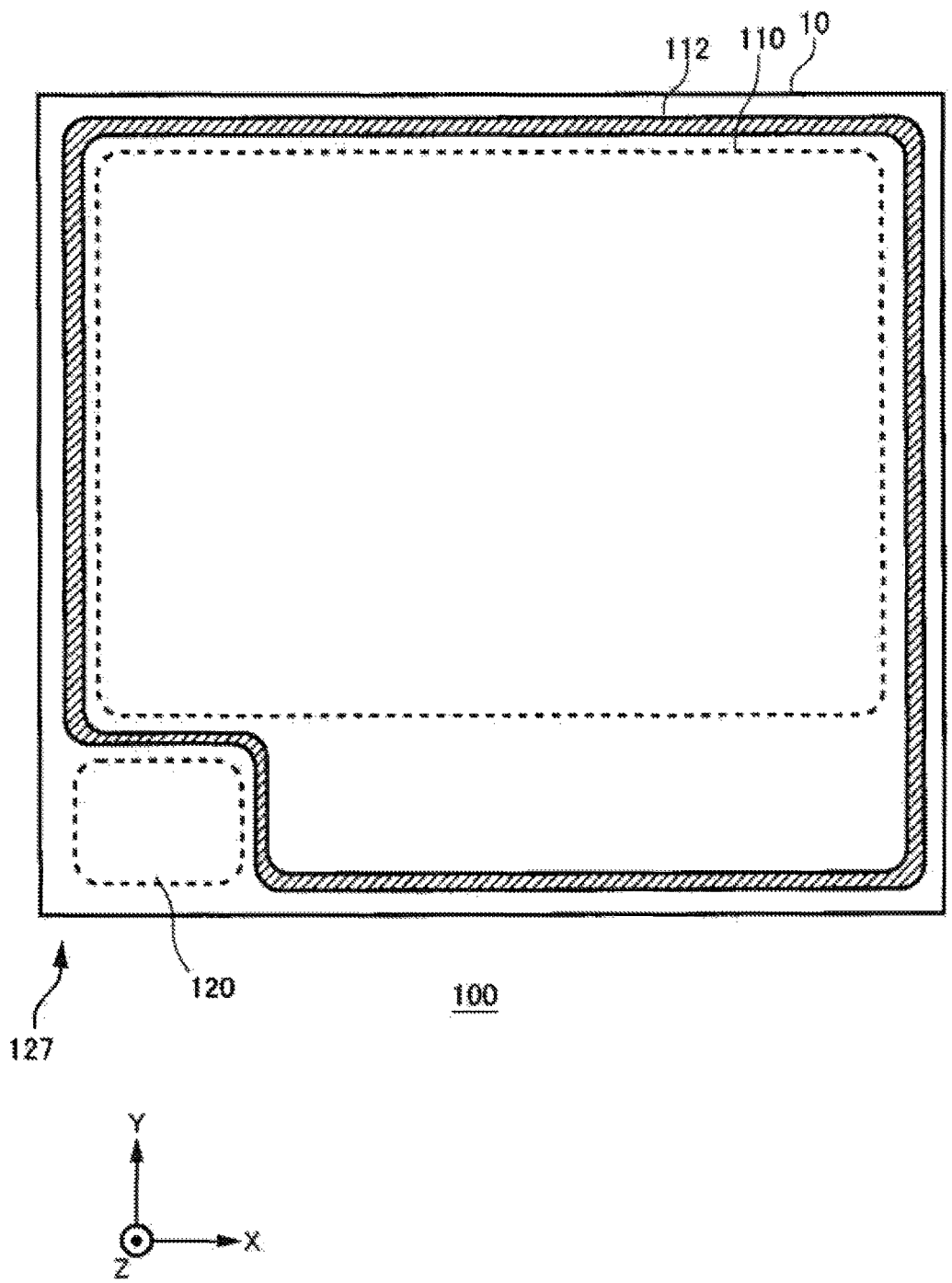
FIG. 11 is a top view showing another example of the semiconductor device 100.

FIG. 11 is a top view showing another example of the semiconductor device 100. In FIG. 11, the pad 114 is omitted. The sense diode portion 120 has been arranged on an inner side of the edge termination structure portion 112 on the upper surface of the semiconductor substrate 10 in the semiconductor device 100 shown in FIG. 1; however, in the present example, the sense diode portion 120 on the upper surface of the semiconductor substrate 10 is arranged on an outer side of the edge termination structure portion 112. It should be noted that the inner side of the edge termination structure portion 112 refers to a region surrounded by the edge termination structure portion 112, and the outer side of the edge termination structure portion 112 refers to a region not surrounded by the edge termination structure portion 112. The outer side of the edge termination structure portion 112 may refer to a region on the opposite side to the region in which the main element portion 110 is provided with the edge termination structure portion 112 in between.

The sense diode portion 120 may be provided at the corner 127 of the semiconductor substrate 10 on the upper surface of the semiconductor substrate 10. Between the edge termination structure portion 112 and the end portion of the semiconductor substrate 10, there is a region in which the main element portion 110 and the like are not provided. By arranging the sense diode portion 120 on the outer side of the edge termination structure portion 112, the sense diode portion 120 can be provided without setting the area of the main element portion 110 small.

Particularly, because the edge termination structure portion 112 is formed in a curved shape at the corner 127 of the semiconductor substrate 10, the region between the edge termination structure portion 112 and the end portion of the semiconductor substrate 10 at the corner 127 of the semiconductor substrate 10 becomes large. For this reason, by arranging the sense diode portion 120 at the corner 127, the sense diode portion 120 can be easily arranged on the semiconductor substrate 10.

Figure 12:
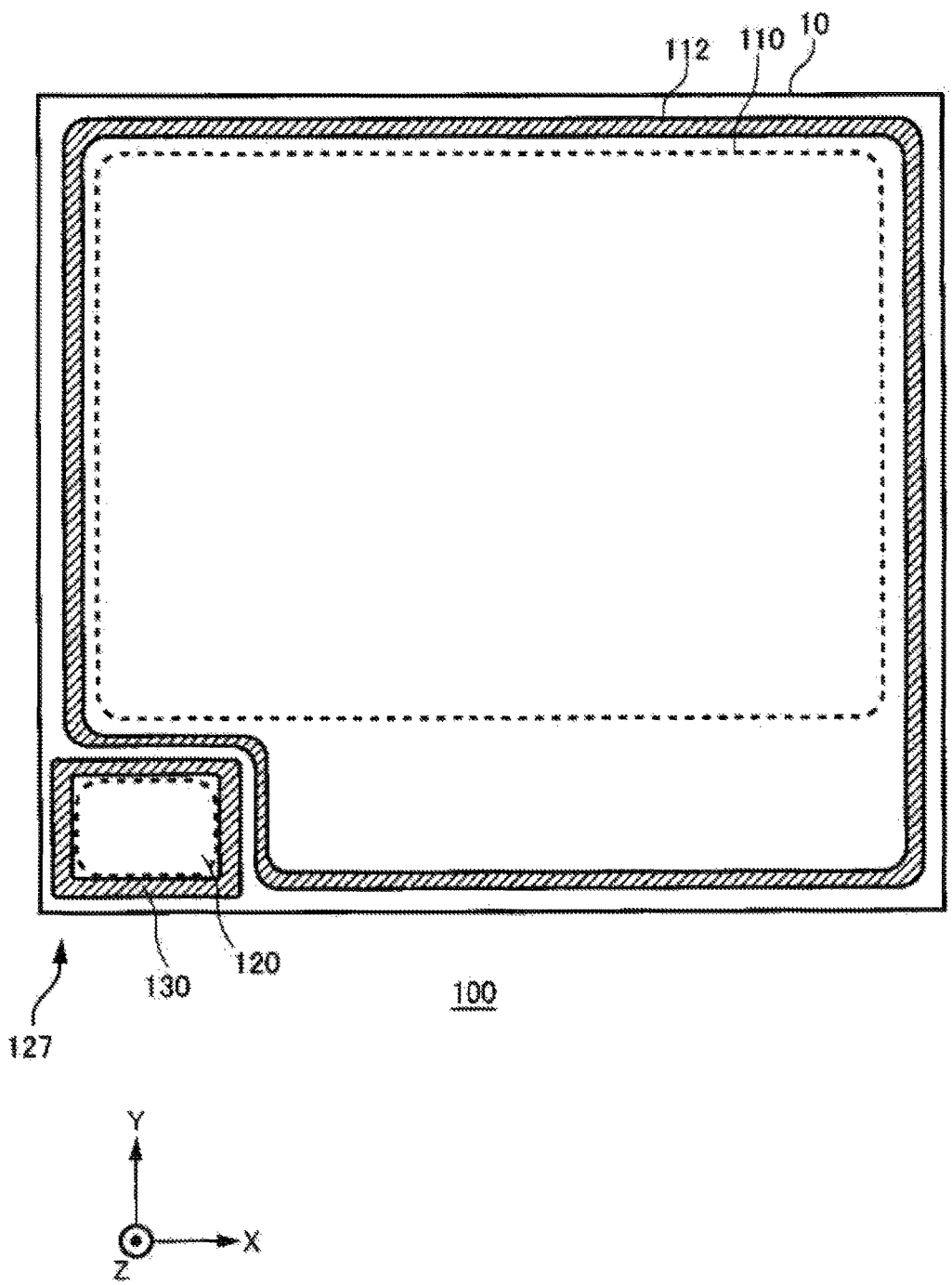
FIG. 12 is a top view showing another example of the semiconductor device 100.

FIG. 12 is a top view showing another example of the semiconductor device 100. In FIG. 12, the pad 114 is omitted. The semiconductor device 100 of the present example further includes an element separation portion 130, compared to the semiconductor device 100 shown in FIG. 11. The element separation portion 130 is provided between the edge termination structure portion 112 and the sense diode portion 120. The element separation portion 130 may be provided surrounding the sense diode portion 120 on the upper surface of the semiconductor substrate 10.

Figure 13:
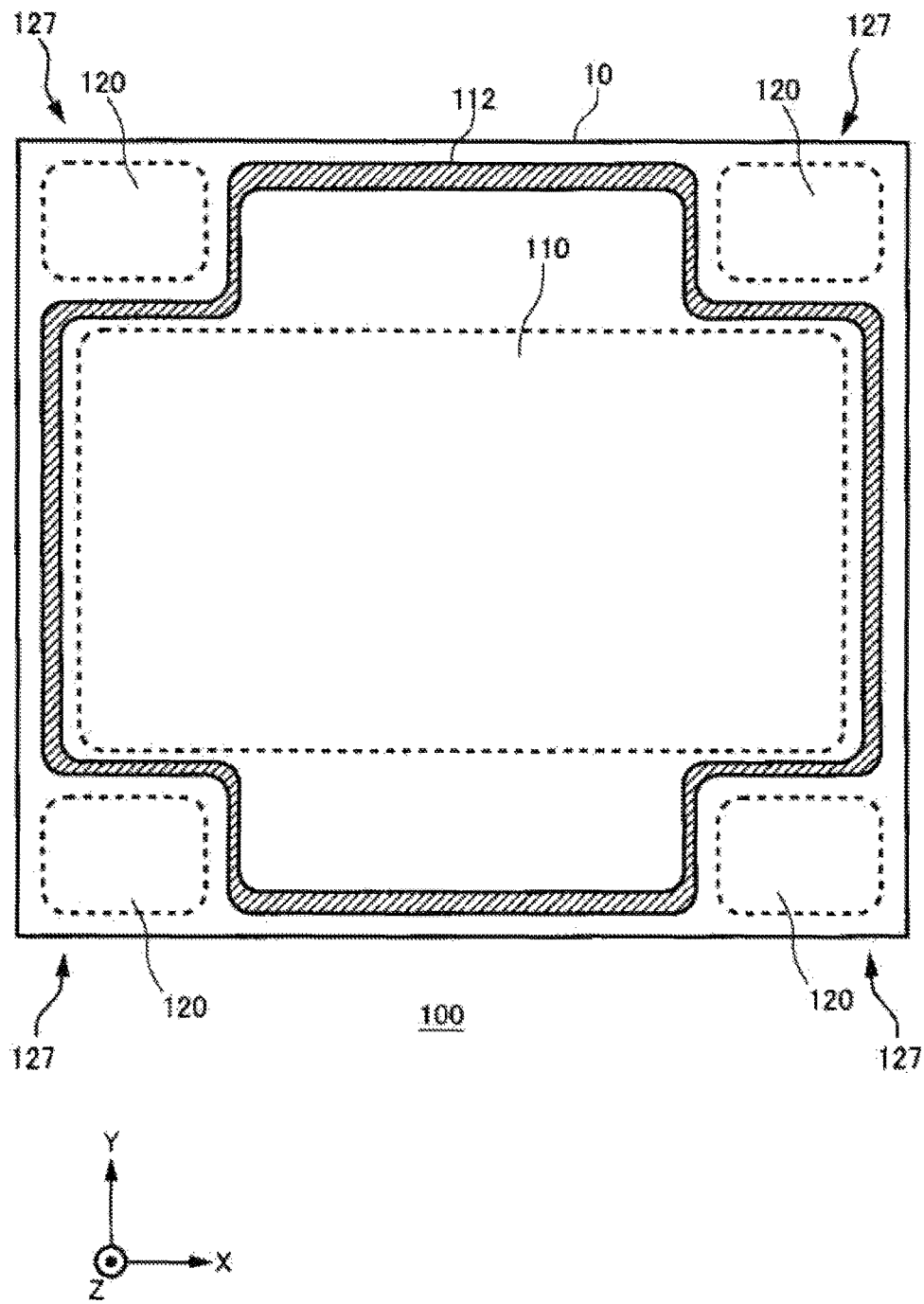
FIG. 13 is a top view showing another example of the semiconductor device 100.

FIG. 13 is a top view showing another example of the semiconductor device 100. In FIG. 13, the pad 114 is omitted. The semiconductor device 100 of the present example includes a plurality of the sense diode portions 120 separated from each other on the upper surface of the semiconductor substrate 10. Each of the sense diode portions 120 may be arranged at each of the corners 127 of the semiconductor substrate 10. Also, the element separation portion 130 may be further provided to each of the sense diode portions 120.

The sensing electrodes 124 of the respective sense diode portions 120 may be electrically connected to each other. That is, the respective sense diode portions 120 may be connected to each other in parallel. Even if a plurality of the sense diode portions 120 are provided, because the current flowing in the sense diode portion 120 is very minute, the loss is not increased significantly. By providing the plurality of the sense diode portions 120, the influence on the variation of the characteristics of the sense diode portion 120 can be reduced, and the overcurrent in the main element portion 110 can be accurately detected.

Also, the sensing electrodes 124 of the respective sense diode portions 120 may be electrically separated from each other. In this case, it is selectable whether to connect any of one or more sense diode portions 120 to the protection circuit 210 at mounting the semiconductor device 100 and the like. For example, by providing a plurality of the sense diode portions 120 having different characteristics from each other, such as a response speed, any of the sense diode portion 120 having the characteristics can be selected to connect to the protection circuit 210 at mounting the semiconductor device 100 and the like.

Also, if the sense diode portion 120 is arranged on the outer side of the edge termination structure portion 112, when the semiconductor substrate 10 is cut off from a semiconductor wafer, it is also considered that a lack of a partial region of the sense diode portion 120 may be generated. By arranging the sense diode portions 120 separated from each other, even if parts of the sense diode portions 120 do not function, because the other sense diode portions 120 function, the overcurrent can be detected.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10 . . . semiconductor substrate, 12 . . . source region, 14 . . . base region, 15 . . . contact region, 17 . . . first well region, 18 . . . drift region, 20 . . . buffer region, 21 . . . upper surface, 22 . . . collector region, 23 . . . lower surface, 26 . . . insulating film, 30 . . . dummy trench portion, 32 . . . dummy insulating film, 34 . . . dummy conductive portion, 40 . . . gate trench portion, 41 . . . straight portion, 42 . . . gate insulating film, 43 . . . edge portion, 44 . . . gate conductive portion, 51 . . . gate wiring portion, 52 . . . emitter electrode, 54 . . . contact hole, 56 . . . contact hole, 57 . . . connection portion, 58 . . . collector electrode, 70 . . . main transistor portion, 80 . . . main diode portion, 82 . . . cathode region, 100 . . . semiconductor device, 110 . . . main element portion, 112 . . . edge termination structure portion, 114 . . . pad, 120 . . . sense diode portion, 122 . . . second well region, 124 . . . sensing electrode, 126 . . . anode region, 127 . . . corner, 128 . . . Ohmic region, 129 . . . region, 130 . . . element separation portion, 132 . . . guard ring, 134 . . . field plate, 140 . . . field plate, 142 . . . guard ring, 200 . . . output device, 210 . . . protection circuit, 220 . . . high side drive circuit, 230 . . . low side drive circuit, 240 . . . resistance, 242 . . . capacity

What is claimed is:

1. A semiconductor device comprising a semiconductor substrate, the semiconductor device comprising:
    an upper-surface electrode that is provided on an upper surface of the semiconductor substrate;
    a sensing electrode that is provided on the upper surface of the semiconductor substrate and is separated from the upper-surface electrode;
    a lower-surface electrode that is provided on a lower surface of the semiconductor substrate;
    a main transistor portion that is provided on the semiconductor substrate and is connected to the upper-surface electrode and the lower-surface electrode;
    a main diode portion that is provided on the semiconductor substrate and is connected to the upper-surface electrode and the lower-surface electrode; and
    a sense diode portion that is provided on the semiconductor substrate and is connected to the sensing electrode and the lower-surface electrode, wherein
    the main transistor portion has:
        a drift region of a first conductivity type that is provided inside the semiconductor substrate;
        a source region of the first conductivity type that is provided between the drift region and the upper surface of the semiconductor substrate and that has an impurity concentration higher than that of the drift region;
        a base region of a second conductivity type that is provided between the drift region and the source region;
        a gate trench portion that is provided reaching the drift region from the upper surface of the semiconductor substrate and is provided extending along a predetermined extending direction in the upper surface of the semiconductor substrate; and
        a first well region that is provided overlapping an edge portion in the extending direction of the gate trench portion in the upper surface of the semiconductor substrate, is provided deeper than the edge portion of the gate trench portion from the upper surface of the semiconductor substrate, and has an impurity concentration higher than that of the base region, and
    the sense diode portion is provided on an outer side the first well region.

2. The semiconductor device according to claim 1, wherein
    the sense diode portion has a second well region that is provided surrounding a predetermined region on the upper surface of the semiconductor substrate, is provided from the upper surface of the semiconductor substrate to the inside of the semiconductor substrate, and has an impurity concentration higher than that of the base region.

3. The semiconductor device according to claim 2, wherein
    the second well region has the impurity concentration higher than that of the first well region.

4. The semiconductor device according to claim 2, wherein
    the second well region is provided deeper than the first well region.

5. The semiconductor device according to claim 2, wherein
    the sense diode portion has the drift region, and
    an anode region of the second conductivity type is provided in a region surrounded by the second well region on the upper surface of the semiconductor substrate, the anode region provided between the upper surface of the semiconductor substrate and the drift region.

6. The semiconductor device according to claim 5, wherein
    a region of the first conductivity type is provided in at least a partial region between the anode region and the second well region on the upper surface of the semiconductor substrate.

7. The semiconductor device according to claim 2, further comprising:
   an element separation portion that is provided between the first well region and the second well region on the upper surface of the semiconductor substrate, is provided from the upper surface of the semiconductor substrate to the inside of the semiconductor substrate, and suppresses a movement of a carrier from the main transistor portion and the main diode portion toward the sense diode portion.

8. The semiconductor device according to claim 1, further comprising:
   an edge termination structure portion that is provided surrounding the main transistor portion and the main diode portion on the upper surface of the semiconductor substrate, wherein
   the sense diode portion is arranged on an outer side of the edge termination structure portion on the upper surface of the semiconductor substrate.

9. The semiconductor device according to claim 8, wherein
   the sense diode portion is arranged at a corner of the semiconductor substrate on the upper surface of the semiconductor substrate.

10. The semiconductor device according to claim 1, further comprising:
    an edge termination structure portion that is provided surrounding the main transistor portion and the main diode portion on the upper surface of the semiconductor substrate, wherein
    the sense diode portion is arranged on an inner side of the edge termination structure portion on the upper surface of the semiconductor substrate.

11. The semiconductor device according to claim 1, wherein
    a plurality of the sense diode portions are provided separately from each other on the upper surface of the semiconductor substrate.

\* \* \* \* \*